(12) United States Patent
Steiniger et al.

(10) Patent No.: US 6,296,895 B1
(45) Date of Patent: Oct. 2, 2001

(54) PROCESS FOR THE APPLICATION OF A TRANSPARENT METAL OXIDE LAYER ON A FILM

(75) Inventors: Gerhard Steiniger, Ronneburg; Rainer Ludwig, Hösbach; Gerd Hoffmann, Bruchköbel, all of (DE)

(73) Assignee: Balzers und Leybold Deutschland Holding AG, Hanau (DE)

( * ) Notice: Subject to any disclaimer, the term of this patent is extended or adjusted under 35 U.S.C. 154(b) by 0 days.

(21) Appl. No.: 08/434,073

(22) Filed: May 1, 1995

(30) Foreign Application Priority Data

Aug. 4, 1994 (DE) ................................. 44 27 581

(51) Int. Cl.[7] .................................. C23C 14/30
(52) U.S. Cl. ........................ 427/10; 427/575; 427/567; 427/585; 427/596; 427/255.31; 427/255.32
(58) Field of Search .................. 427/10, 567, 575, 427/585, 177, 126.4, 255.3, 255.5, 596, 255.31, 255.32

(56) References Cited

U.S. PATENT DOCUMENTS

| | | | |
|---|---|---|---|
| 2,769,778 | * 11/1956 | Silvey | 204/192.29 |
| 3,356,529 | * 12/1967 | Kiser et al. | 117/201 |
| 4,024,091 | 5/1977 | Wilmanns | 427/10 |
| 4,514,437 | * 4/1985 | Nath | 427/39 |
| 4,627,989 | * 12/1986 | Feuerstein et al. | 427/10 |
| 5,011,585 | * 4/1991 | Brochet et al. | 204/192.13 |
| 5,230,923 | * 7/1993 | Hirokawa et al. | 427/248.1 |

FOREIGN PATENT DOCUMENTS

| | | |
|---|---|---|
| 970607 | 7/1949 | (DE) . |
| 1228489 | 4/1959 | (DE) . |
| 2834813 | 3/1980 | (DE) . |
| 4018399 | 12/1991 | (DE) . |
| 103521 | 3/1984 | (EP) . |
| 261245 | 9/1987 | (EP) . |
| 62103359 | * 5/1987 | (JP) . |
| 63223163 | * 9/1988 | (JP) . |

\* cited by examiner

*Primary Examiner*—Timothy Meeks
(74) *Attorney, Agent, or Firm*—Fulbright & Jaworski, LLP

(57) ABSTRACT

A pure metal is vaporized in a receiver, and a quantity of oxygen slightly substoichiometric for the oxide is introduced. To determine the thickness of the layer deposited on the film and to control the vaporization rate, optical sensors are installed in an area where the layer, because of the presence of unoxidized metal, has sufficient absorption for optical measurement. After the determination of the transparency by the sensors, the layer is subjected to a secondary oxidation process.

8 Claims, 1 Drawing Sheet

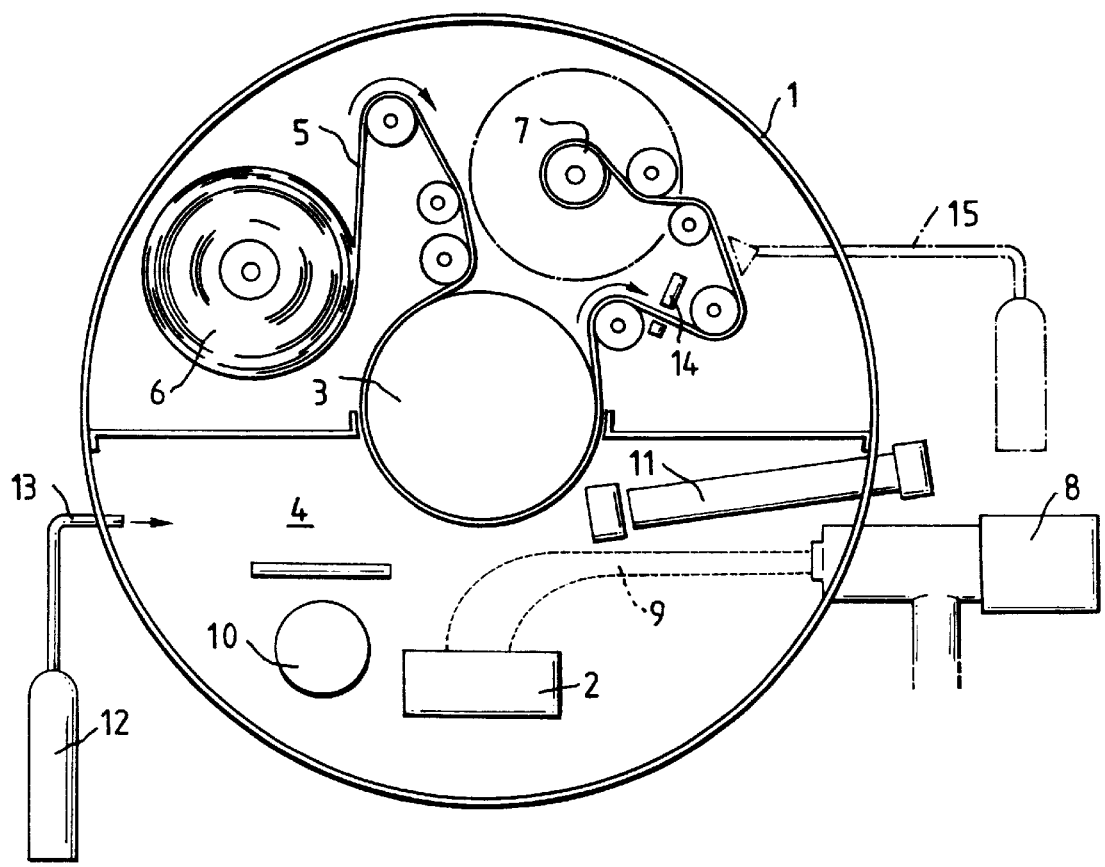

PROCESS FOR THE APPLICATION OF A TRANSPARENT METAL OXIDE LAYER ON A FILM

BACKGROUND OF THE INVENTION

The invention pertains to a process for the application of a transparent metal oxide layer on a film, in which a metal is vaporized in a receiver and brought into contact in the vapor phase with oxygen.

Systems which operate according to a process of this type are known in coating technology. As an example, see U.S. Pat. No. 5,302,208, although it does not have reactive vapor deposition as its object. In the system described in this publication, an electron beam is used to vaporize a metal oxide. The vapor cloud is converted to a plasma by microwave energy, which is supplied by way of a horn antenna, as a result of which layers with especially good properties are obtained.

For an example of the reactive vaporization of a metal for the coating of a substrate, see U.S. Pat. No. 4,777,062. Like the preceding patent, this document does not deal with the problem of controlling the vaporization rate and thus not with the problem of producing a layer of precisely defined thickness.

For the coating of films with aluminum, it is known that several optical sensors can be provided in the receiver, behind the coating window, distributed across the width of the film. These sensors measure the transmission or optical density of the film coated with aluminum, and the power and/or motion of the electron beam over the metal crucible are controlled in accordance with output of these sensors. When a film is coated with a transparent material such as $Al_2O_3$, it is not possible to monitor the thickness of the layer in this way if the coated material is highly transparent. Such transparency is required, for example, in the case of films used to package food products, because it must be possible to see the food products easily, because the color of the food products may not be negatively affected by the packaging, and finally because it must be possible to heat quickly the contents of package in its packaging by means of microwaves. So far, the thickness of transparent layers has been measured by means of x-rays, but this is a relatively complicated method.

SUMMARY OF THE INVENTION

The invention is based on the problem of determining the thickness of a transparent oxide layer on a film in a very simple manner during the application process.

This problem is solved by introducing a slightly substoichiometric amount of oxygen, i.e., an amount not sufficient to produce a completely transparent metal oxide layer, into the receiver. To determine the thickness of the applied layer and to control the vaporization rate, optical sensors are provided in an area where the layer, thanks to presence of unoxidized metal, has an absorption sufficient for optical measurement; and in that, after the transparency has been determined by the sensors, the layer is subjected to a secondary oxidation process.

By means of a process such as this, it is possible, even in the production of highly transparent metal oxide layers, to determine the layer thickness on-line with simple optical sensors and to control the coating system accordingly. The basic idea of the invention is first to produce a layer which is not completely transparent so that it is still possible to measure the layer thickness by means of the transmission or optical density of the layer, and then to make the layer completely transparent afterwards by means of a secondary oxidation step. Conducting the coating process with a substoichiometric amount of oxygen in the receiver offers the additional advantage that the undesirable formation of a porous layer which can result from an excessive amount of oxygen can be reliably prevented. The process according to the invention will be used primarily for the coating of transparent films. By means of the optical sensors, therefore, the light which will be measured will be that which shines through the coated film. But it is also possible for sensors to determine the reflective power of a coating. Then the process according to the invention can also be applied to opaque films.

The secondary oxidation step can be accomplished in various ways. It is especially simple when the secondary oxidation is conducted outside the receiver by means of the oxygen content of the air. A secondary oxidation of this type can be carried out, for example, while the film is being unwound from a supply roll and packaging materials are being made from it.

It is also possible, however, as an alternative, to carry out the secondary oxidation in an oxidation stage installed downline from the optical sensors.

In principle, the process according to the invention is independent of how the metal is vaporized. When an electron beam passing over a crucible filled with metal is provided as the means of vaporizing the metal, then, as a way of controlling the thickness of the layer, it is advantageous to adjust the power of the electron beam as a function of the measurement values of the optical sensor.

Transparent oxide layers can be produced from the oxides of various metals, especially Al, Cr, Si, Sn, and Al alloys. In practice, the process of the invention has been tested and found especially advantageous for the production of a layer of aluminum oxide.

The properties of the layer, especially the barrier effect with respect to oxygen and odors vital to good food packaging materials, are especially advantageous when a plasma is produced in the receiver. As a result of this measure, the metal oxide molecules are in the form of ions when they strike the layer at elevated velocity, and a denser layer is produced as a result.

It is advantageous for the plasma to be produced by feeding microwave energy into the cloud of metal vapor.

A layer of uniform thickness can be produced even over the entire width of wide films when the absorption of the film is measured at several points across the width, and when the power and/or the movement of the electron beam over the crucible with the metal to be vaporized is controlled on the basis of these values.

BRIEF DESCRIPTION OF THE DRAWING

The sole FIGURE is a schematic, vertical cross section through a coating system suitable for implementing the process according to the invention.

DETAILED DESCRIPTION OF THE PREFERRED EMBODIMENT

In the drawing, a cylindrical receiver 1 is shown, in which an elongated crucible 2, containing aluminum, is provided. Above this crucible 2 is a coating roll 3, which forms the top boundary of a coating chamber 4. A film 5 to be coated, which is unwound from a supply roll 6 and wound up on a take-up roll 7, runs continuously around coating roll 3.

To vaporize the metal in crucible 2, an electron beam gun 8 is used, the electron beam 9 of which is deflected by a magnetic coil 10 toward crucible 2. To generate a plasma in the cloud of vapor thus produced, microwave energy is introduced into coating chamber 4 by means of a horn antenna 11. Because film 5 is to be coated with a metal oxide, but the material being vaporized in crucible 2 is a pure metal, it is necessary to introduce oxygen into coating chamber 4, which is indicated schematically by an oxygen source 12 and an oxygen line 13 leading into coating chamber 4. This oxygen is introduced by means of a flow controller (not shown) at a very constant rate and with extreme uniformity in an amount determined by preliminary experiment.

The transmission or optical density of film 5 is monitored by an optical sensor 14, which is set up behind coating roll 3. Several such sensors 14 are provided cross the width of film 5. An oxidation stage 15 is suggested in broken line, located behind sensor 14 in the direction of travel. The presence of such a stage is not mandatory; in it, oxygen can be blown against film 5.

It is important for the invention that the amount of oxygen introduced into coating chamber 4 be substoichiometric, so that not all of the metal is oxidized and therefore so that the layer formed on film 5 is not completely transparent. Because the amount of oxygen introduced is substoichiometric, the layer on film 5 has a degree of absorption sufficient to make it possible for optical sensors 14 provided across the width of film 5 to measure the thickness of the layer on the basis of this absorption. This makes it simple to control the coating process, in that, if the layer is too thick or not thick enough, the power and/or scanning motion of electron beam 9 over the surface of the metal in crucible 2 can be appropriately adjusted.

The process according to the invention was tested in practice with pure aluminum as the metal for the layer to be deposited on the plastic film. It was found that the secondary oxidation step leading to nearly complete transparency occurs by itself in the atmosphere while the film is being processed into packaging, which means that there is no need for a separate oxidation stage within the system. To produce a layer of the desired thickness, it is possible for the absorption of the layer to be kept constant at 5%, for example. After the secondary oxidation process, the absorption of the layer is then less than 1%, in contrast to an absorption of about 10% in the uncoated film. A reasonable range for the nominal value of the absorption by the layer is between 3 and 20%. Through the secondary oxidation according to the invention, absorption values 0–8% are obtained in the layer, which means that the layers are almost completely transparent.

What is claimed is:

1. Process for applying a transparent metal oxide on a film, comprising passing a film through a receiver, vaporizing metal in said receiver to produce vapor phase metal, introducing oxygen into said receiver in order to produce a metal oxide layer on said film, said oxygen being introduced in an amount which is not sufficient to produce a stoichiometric metal oxide layer on said film, whereby said layer is not completely transparent, said layer having an absorption coefficient, measuring the absorption coefficient of said layer using optical sensors, said absorption coefficient providing a means for determining thickness of the layer, controlling the rate of vaporizing metal based on the absorption coefficient, and subjecting the layer to further oxidation in order to produce a stoichiometric oxide which is fully transparent.

2. Process as in claim 1 wherein said layer is subjected to secondary oxidation by exposure to air outside of said receiver.

3. Process as in claim 1 wherein said layer is subjected to secondary oxidation by an oxidation stage downstream of said optical sensors.

4. Process as in claim 1 wherein said metal is vaporized by passing an electron beam over a crucible containing said metal, said beam has a power, and said metal is vaporized at a rate which is controlled by adjusting the power of the electron beam as a function of the absorption coefficient.

5. Process as in claim 1 wherein said metal is aluminum.

6. Process as in claim 1 wherein a plasma is generated in the receiver.

7. Process as in claim 1 wherein microwave energy is introduced into said vapor phase metal.

8. Process as in claim 1 wherein said absorption coefficient is measured at plural points across the width of the film, and wherein said metal is vaporized by moving an electron beam over a crucible containing said metal, said beam having a power, said metal being vaporized at a rate which is controlled by at least one of adjusting power and adjusting movement of the electron beam based on absorption coefficients at said plural points.

* * * * *